(12) United States Patent
Ishii et al.

(10) Patent No.: US 9,196,816 B2
(45) Date of Patent: Nov. 24, 2015

(54) PIEZOELECTRIC OSCILLATION DEVICE WITH ELASTIC BODY AND TOUCH PANEL HAVING SAME

(75) Inventors: Shigeo Ishii, Gunma (JP); Norikazu Sashida, Gunma (JP); Yoshiyuki Watanabe, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 286 days.

(21) Appl. No.: 13/995,616

(22) PCT Filed: Dec. 26, 2011

(86) PCT No.: PCT/JP2011/079989
§ 371 (c)(1),
(2), (4) Date: Jun. 19, 2013

(87) PCT Pub. No.: WO2012/090893
PCT Pub. Date: Jul. 5, 2012

(65) Prior Publication Data
US 2013/0271418 A1    Oct. 17, 2013

(30) Foreign Application Priority Data

Dec. 28, 2010 (JP) ................................. 2010-293779

(51) Int. Cl.
*H01L 41/08* (2006.01)
*H01L 41/09* (2006.01)
(Continued)

(52) U.S. Cl.
CPC ............ *H01L 41/0973* (2013.01); *G06F 3/016* (2013.01); *G06F 3/041* (2013.01)

(58) Field of Classification Search
USPC .......................................... 310/330–332, 348
See application file for complete search history.

(56) References Cited

U.S. PATENT DOCUMENTS

| 2005/0023937 A1* | 2/2005 | Sashida et al. ................ 310/348 |
| 2005/0174336 A1 | 8/2005 | Nakayama et al. |
| 2007/0080951 A1 | 4/2007 | Maruyama et al. |

FOREIGN PATENT DOCUMENTS

| JP | 2004-094389 A | 3/2004 |
| JP | 2005-45691 A | 2/2005 |

(Continued)

OTHER PUBLICATIONS

Japanese Office Action dated Apr. 30, 2014, in a counterpart Japanese patent application No. 2012-550916.

(Continued)

*Primary Examiner* — J. San Martin
(74) *Attorney, Agent, or Firm* — Chen Yoshimura LLP

(57) ABSTRACT

In a piezoelectric oscillation device in which a support substrate is oscillated using a bimorph-type piezoelectric oscillation element, the click sensation when the support substrate is operated is improved, and shock resistance of a control panel is improved. Provided is a piezoelectric oscillation device in which wiring is not easily broken. On the rear side of a touch panel (16), one main surface of a bimorph-type piezoelectric oscillation element (20) is entirely bonded via an elastic body (18) having a tensile elasticity of 20-100 MPa as measured according to JIS K7161. The piezoelectric oscillation element (20) has surface electrode layers (30A, 30B) connected to terminal electrodes (36A, 36B) via wiring lines (38A, 38B). The wiring lines (38A, 38B) are formed on top of a wiring protection layer (32) made of an elastic body provided on the rear side of the touch panel (16), and because the wiring lines can move following the displacement and are therefore resistant to breakage. When the piezoelectric oscillation element (20) is displaced toward the touch panel (16), it can transmit a greater amount of displacement to the touch panel (16) than when it is displaced to the opposite side.

4 Claims, 3 Drawing Sheets

(51) Int. Cl.
*G06F 3/01* (2006.01)
*G06F 3/041* (2006.01)

(56) References Cited

FOREIGN PATENT DOCUMENTS

| JP | 2005-222326 A | 8/2005 |
|----|---------------|--------|
| JP | 2008-130055 A | 6/2008 |
| JP | 2010-108490 A | 5/2010 |
| JP | 2010-146576 A | 7/2010 |
| JP | 2011-175518 A | 9/2011 |
| KR | 10-0759039 B1 | 9/2007 |
| KR | 10-0974062 B1 | 8/2010 |

OTHER PUBLICATIONS

Korean Office Action dated Mar. 31, 2014, in a counterpart Korean patent application No. 10-2013-7012562.
International Search Report (ISR) issued in PCT/JP2011/079989 mailed in Jan. 2012.
Written Opinion (PCT/ISA/237) issued in PCT/JP2011/079989 mailed in Jan. 2012.

* cited by examiner (A)

(B)

(C)

(A)

(B)

(C)

(D)

PIEZOELECTRIC OSCILLATION DEVICE WITH ELASTIC BODY AND TOUCH PANEL HAVING SAME

TECHNICAL FIELD

The present invention relates to a piezoelectric oscillation device such as a force feedback touch panel (a panel that vibrates when touched by a finger), for example.

BACKGROUND ART

A piezoelectric element has a feature of generating bulk strain by the reverse piezoelectric effect, and actuators that utilize this feature are commercialized in various fields. Piezoelectric elements are also used for electronic devices such as a touch panel and a display device equipped with an input sensor. Japanese Patent Application Laid-Open Publication No. 2005-222326 (Patent Document 1), for example, discloses a tablet device in which a single layer piezoelectric body is bonded to a support substrate that supports an operation panel from the rear side thereof, and the support substrate vibrates when the operator conducts an input operation on the operation panel, thereby applying vibrations to the operator in response to the input.

RELATED ART DOCUMENT

Patent Document

Patent Document 1: Japanese Patent Application Laid-Open Publication No. 2005-222326

SUMMARY OF THE INVENTION

Problems to be Solved by the Invention

However, in the technology disclosed in Patent Document 1 above, the piezoelectric body utilizes a piezoelectric element having a single layer unimorph structure, and because the piezoelectric element vibrates in parallel with the support substrate, in order to allow the operator to feel the vibration, it is necessary to use an adhesive agent that has a high elasticity. Bimorph piezoelectric elements that can obtain a large displacement with a low input voltage are also known as a type of piezoelectric oscillation elements, and there is a demand for a touch panel device that is equipped with such a bimorph piezoelectric element and that can reliably apply vibrations to the user in response to the operation. In such a touch panel device, it is necessary to make the operation panel move largely by the vibration of the bimorph piezoelectric element, to improve the shock resistance of the operation panel, and to ensure the stable connection between wiring lines.

An embodiment of the present invention aims at improving response to a click in operating the support substrate, along with improving the shock resistance of the operation panel, in a piezoelectric oscillation device in which the support substrate is caused to vibrate by a bimorph piezoelectric oscillation element. An embodiment of the present invention further provides a piezoelectric oscillation device in which wire disconnections are not likely to occur.

Means for Solving the Problems

A piezoelectric oscillation device according to an embodiment of the present invention includes a support substrate and a piezoelectric oscillation element that causes the support substrate to vibrate. In one embodiment, the piezoelectric oscillation element is a bimorph piezoelectric element, and one main surface of the piezoelectric oscillation element is entirely bonded to the support substrate through an elastic body having a tensile elasticity of 20 to 100 MPa as measured according to JIS K7161 (measured at a temperature of 25° C. and humidity of 60%; below, unless otherwise specified, the tensile elasticity was measured under the same conditions). In one embodiment, the thickness of the elastic body is 50 to 160 µm.

In a piezoelectric oscillation device according to another embodiment, the support substrate includes: a terminal substrate that is disposed on the same surface as the surface on which the piezoelectric oscillation element is bonded, the terminal substrate having a terminal electrode; a wiring line that connects the terminal electrode of the terminal substrate to an electrode of the piezoelectric oscillation element, and a wiring protective layer that is disposed between the wiring line and the support substrate, the wiring protective layer being made of an elastic material. In a piezoelectric oscillation device according to yet another embodiment, the elastic body interposed between the support substrate and the piezoelectric oscillation element and the wiring protective layer are made of the same material.

A touch panel device according to an embodiment of the present invention includes: a support substrate; a bimorph piezoelectric oscillation element that causes the support substrate to vibrate; a frame that supports the support substrate; a display part that displays information, the display part being disposed on a rear side of the support substrate; and a driver that drives the piezoelectric oscillation element in response to a contact operation conducted by a user on the support substrate, wherein one main surface of the piezoelectric oscillation element is entirely bonded to the support substrate through an elastic body having a tensile elasticity of 20 to 100 Mpa as measured according to JIS K7161. Additional objects, features, and advantages of the present invention will become apparent from the detailed description below and appended drawings.

Effects of the Invention

According to an embodiment of the present invention, it is possible to improve response to a click for operating the support substrate, along with improving the shock resistance of the operation panel, in a piezoelectric oscillation device in which the support substrate is caused to vibrate by a bimorph piezoelectric oscillation element. Also, with an embodiment of the present invention, a piezoelectric oscillation device in which wire disconnections are not likely to occur is provided.

BRIEF DESCRIPTION OF THE DRAWINGS

FIG. 1(A) is an exterior perspective view of the entire touch panel device when viewed from the rear side. FIG. 1(B) is a cross-sectional view along the line #A-#A of FIG. 1(A) when viewed from the direction of the arrow. FIG. 1(C) is a cross-sectional view of an example of a multi-layer structure of a piezoelectric element.

DETAILED DESCRIPTION OF EMBODIMENTS

Below, an embodiment of the present invention will be explained in detail based on examples.

First, a piezoelectric oscillation generating device of an embodiment of the present invention will be explained with reference to FIGS. 1 to 3. The piezoelectric oscillation generating device of an embodiment of the present invention is applied to a force feedback touch panel device, for example.

Figure 1:
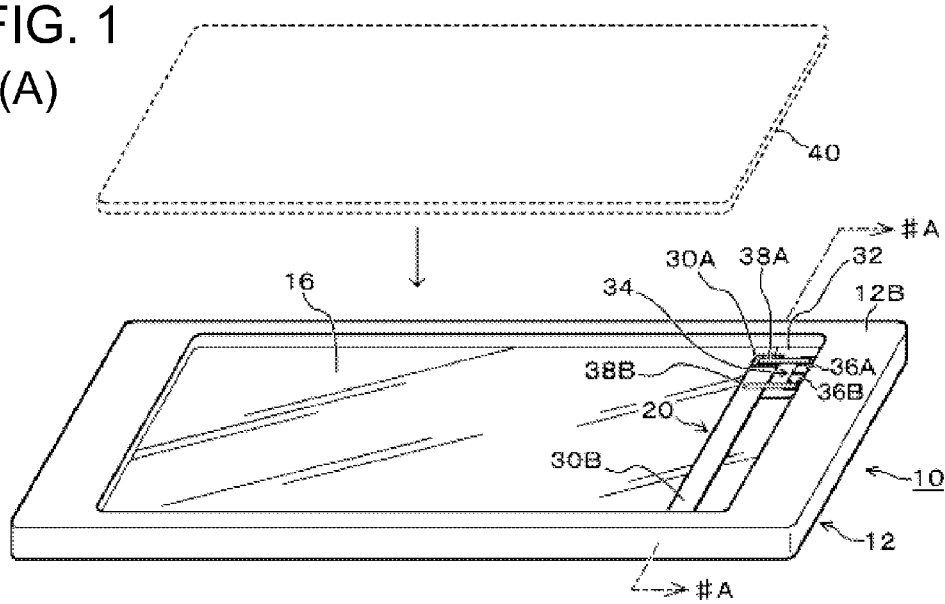
FIG. 1 shows diagrams illustrating a touch panel device of an embodiment of the present invention.
Figure 1:
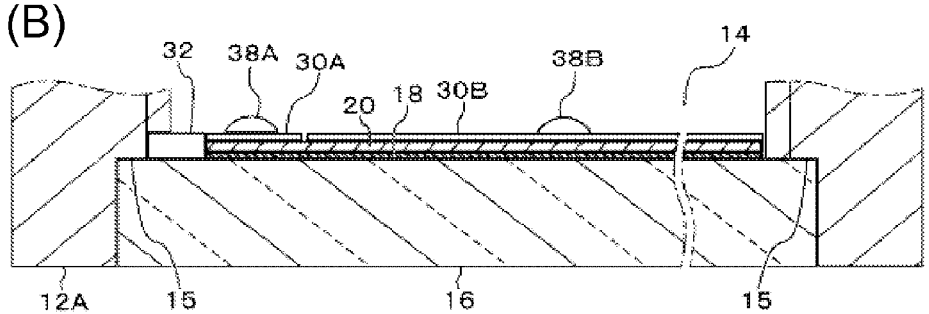
Figure 1:
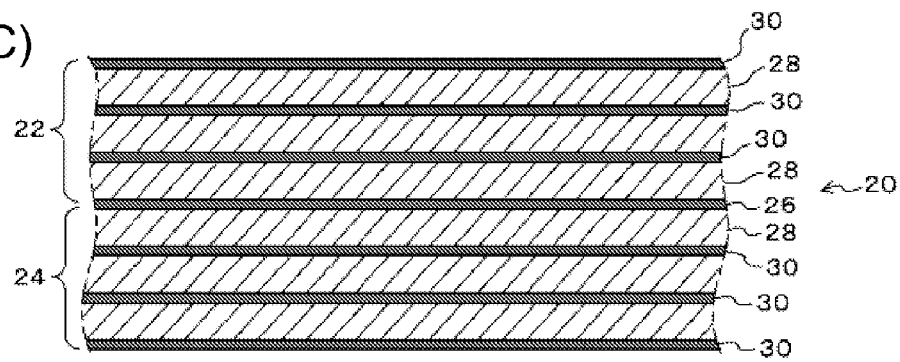
Figure 2:
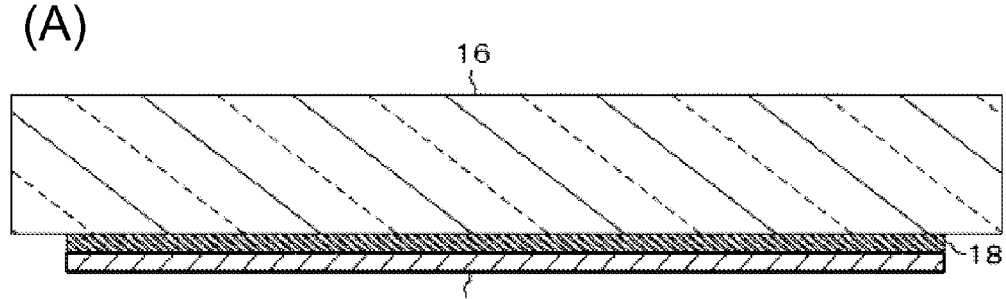
FIG. 2 is a cross-sectional view illustrating an operation of the touch panel device of FIG. 1.
Figure 2:
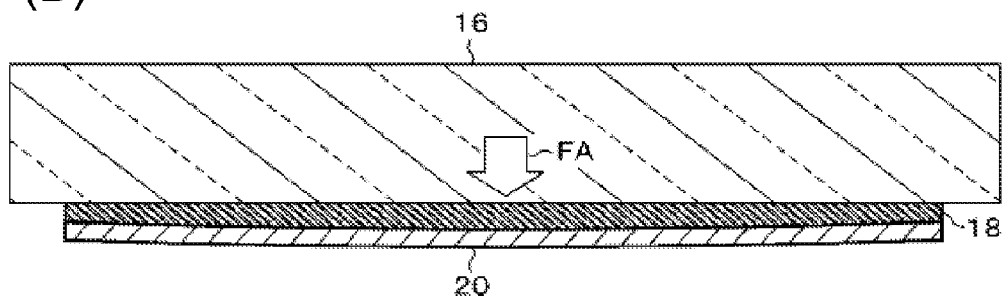
Figure 2:
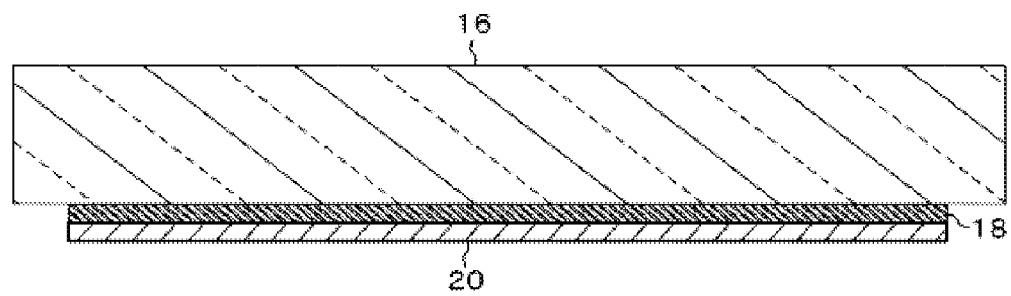
Figure 2:
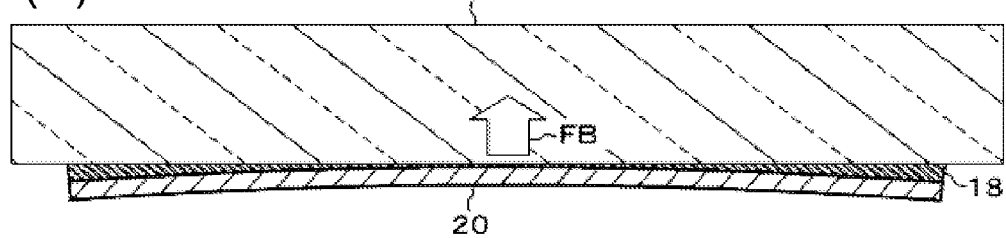

As shown in FIG. 1, a touch panel device 10 of an embodiment of the present invention includes a touch panel (support substrate) 16, and the periphery of the touch panel 16 is supported by a receiving section 15 provided in an opening 14 of a frame 12. On the rear surface of the touch panel 16, a piezoelectric oscillation element 20 is bonded along the short side direction. One main surface of the piezoelectric oscillation element 20 is bonded to the rear surface of the touch panel 16 through an elastic body 18. The entire main surface of the piezoelectric oscillation element 20 may be directly bonded to the touch panel 16 so as to improve a shock resistance of the touch panel 16. The location of the piezoelectric oscillation element 20 is not limited to that shown in FIG. 1, and may be appropriately changed. The frame 12 is formed of an aluminum alloy, for example. The touch panel 16 is formed by layering a not-shown transparent electrode such as a transparent conductive film (ITO) on a polycarbonate resin, a quartz glass, or the like, for example. The elastic body 18 is made of an elastic material such as polyurethane or EPDM (ethylene propylene diene monomer rubber), for example, but is not limited thereto. When the tensile elasticity of the elastic body 18, which was measured according to JIS K7161 (below, when simply referred to as the "elasticity," it means the tensile elasticity that was measured according to JIS K7161 unless indicated otherwise), is smaller than 20 MPa, it becomes harder for the touch panel 16 to receive the vibration of the piezoelectric vibration element 20. On the other hand, when the elasticity exceeds 100 MPa, a difference in rigidity between when a compressive force is applied to the elastic body 18 and when a pulling force is applied to the elastic body 18 is made smaller, which makes it difficult to transmit the vibration of the piezoelectric oscillation element 20 to the touch panel 16 in an asymmetric manner, as described below. Thus, in one embodiment of the present invention, the elasticity of the elastic body 18 is to be within a range of 20 to 100 MPa. In one embodiment, the thickness of the elastic body 18 is set to 50 to 160 μm. When the thickness of the elastic body 18 is smaller than 50 μm, it becomes harder for the operator to sense the elastic displacement of the elastic body 18, and as a result, a sufficient response to a click, which will be described later, cannot be achieved. On the other hand, if the thickness exceeds 160 μm, it becomes harder for the vibration of the piezoelectric oscillation element 20 to be transmitted to the touch panel 16. Between the touch panel 16 and the elastic body 18, and between the elastic body 18 and the piezoelectric oscillation element 20, an epoxy adhesive, an acrylic adhesive, or a silicon adhesive, for example, is provided in a thickness of approximately 20 to 50 μm, for example.

In one embodiment, the piezoelectric oscillation element 20 is a bimorph piezoelectric oscillation element. As shown in FIG. 1(C), the piezoelectric oscillation element 20 includes a piezoelectric element 22 and a piezoelectric element 24, and the piezoelectric element 22 and the piezoelectric element 24 are each made by laminating piezoelectric layers 28 and electrode layers 30. The piezoelectric element 22 and the piezoelectric element 22 are stacked, sandwiching an electrode layer 26. The piezoelectric layer 28 is made of PZT piezoelectric ceramics, for example, and the electrode layer 30 is made of silver, for example. The number and thickness of the piezoelectric layers 28 and the electrode layers 30 constituting the piezoelectric oscillation element 20 are appropriately selected, and are not limited to the number and the thickness that are provided as examples in the present specification. In one example, each piezoelectric layer 28 is formed to a thickness of approximately 18 to 66 μm, and the piezoelectric element 22 and the piezoelectric element 24 include 6 to 20 layers of the piezoelectric layers 28. As shown in FIG. 1(B), each electrode layer 30 is constituted of an electrode layer part 30A and an electrode layer part 30B disposed to be separated from each other. The electrode layer 30 may alternatively be constituted of one solid layer. The bimorph piezoelectric oscillation element 20 has not-shown through-holes formed therein, and via these through-holes, the respective piezoelectric layers 28 are connected to each other.

On the rear surface of the touch panel 16, a terminal substrate 34 is formed. The terminal substrate 34 includes terminal electrodes 36A and 36B that are respectively connected to the electrode layer parts 30A and 30B. The terminal substrate 34 is bonded to the touch panel 16 through a wiring protective layer 32 made of an elastic body. The terminal electrodes 36A and 36B are connected to the electrode layer parts 30A and 30B through wiring lines 38A and 38B. The wiring lines 38A and 38B are made of a conductive paste, for example. The wiring lines 38A and 38B are formed on the wiring protective layer 32 made of an elastic body, and because the wiring lines 38A and 38B can move following the vibration of the piezoelectric oscillation element 20, wire disconnections are not likely to occur. The wiring protective layer 32 is made of a urethane resin or the like, in a manner similar to the elastic body 18, for example. By making the wiring protective layer 32 of the same material as the elastic body 18, the bonding strength between the two can be improved.

On the rear surface of the touch panel 16, a rear panel 40 is disposed to display various types of information. The rear panel 40 is disposed on the touch panel 16 so as to seal the opening 14 of the frame 12. A speaker element may be provided in the sealed opening 14 in the touch panel device 10. The touch panel device 10 includes a known operating position detection mechanism for detecting a pressed position when a pressure was applied to the touch panel 16. The touch panel device 10 also includes a driver circuit (not shown) that applies a driving voltage for causing the piezoelectric oscillation element 20 to vibrate when the user presses the touch panel 16. The driver circuit is connected to the electrode layer parts 30A and 30B of the piezoelectric oscillation element 20 through the terminal electrodes 36A and 36B of the terminal substrate 34 and the wiring lines 38A and 38B.

Next, with reference to FIG. 2, an operation of the touch panel device 10 of an embodiment of the present invention will be explained. FIG. 2 is a cross-sectional view showing a part of the touch panel device 10, with the top and bottom of the touch panel device 10 being reversed from FIG. 1(B). FIG. 2(A) shows a state in which a driving voltage is not supplied to the electrode layer parts 30A and 30B of the touch panel device 10. When an AC driving voltage is applied from a not-shown driver circuit to the electrode layer parts 30A and 30B via the terminal electrodes 36A and 36B and the wiring lines 38A and 38B, the piezoelectric oscillation element 20 moves alternately toward the opposite side from the touch panel 16 (the direction indicated with the arrow FA in FIG. 2(B)) and toward the touch panel 16 side (the direction indicated with the arrow FB in FIG. 2(D)). In other words, when an AC driving voltage is applied, the piezoelectric oscillation element 20 vibrates along the top and bottom direction that is perpendicular to the main surface of the touch panel 16 between the position shown in FIG. 2(B) and the position shown in FIG. 2(D). FIG. 2(C) shows a state in which the piezoelectric oscillation element 20 is at the middle position between the position shown in FIG. 2(B) and the position shown in FIG. 2(D). When the piezoelectric oscillation element 20 moves toward the opposite side from the touch panel 16, an external force in a pull direction acts on the electric body 18, which decreases the rigidity of the elastic body 18, and on the other hand, when the piezoelectric oscillation element 20 moves toward the touch panel 16, the elastic body 18 is compressed, which increases the rigidity of the elastic body 18. Therefore, when the piezoelectric oscillation element 20 moves toward the touch panel 16, the movement of the piezoelectric oscillation element 20 is transmitted more easily to the touch panel 16 as compared with when moving toward the opposite side, and as a result, the touch panel 16 can be moved to a greater degree by the displacement of the piezoelectric oscillation element 20. This makes it possible to reliably provide a click feeling to a finger tip of the user who operates the touch panel 16. As described above, even though the piezoelectric oscillation element 20 vibrates symmetrically along the vertical direction, it is easier for the user to feel the displacement of the piezoelectric oscillation element 20 toward the touch panel 16 side.

The rigidity is a measure of the resistance of a structural object to deformation, and is typically defined as a product of the cross-sectional shape (elastic secondary moment) of the object and the elasticity of the material (see "Plastic Dictionary" by Kogyo Chosakai Publishing Co., Ltd., for example). The rigidity of an elastic body typically decreases when receiving a pulling force (when deforming in a pull direction), and increases when receiving a compressive force (when deforming in a compressive direction). Due to such characteristics of the elastic body, when the piezoelectric oscillation element 20 moves toward the opposite side from the touch panel 16, the rigidity of the elastic body 18 decreases, and on the other hand, when the piezoelectric oscillation element 20 moves toward the touch panel 16, the rigidity of the elastic body 18 increases. As a result, the movement of the piezoelectric oscillation element 20 toward the touch panel 16 is transmitted more easily than the movement away from the touch panel 16, and the movement of the piezoelectric oscillation element 20 is transmitted to the touch panel 16 in an asymmetric manner.

Figure 3:
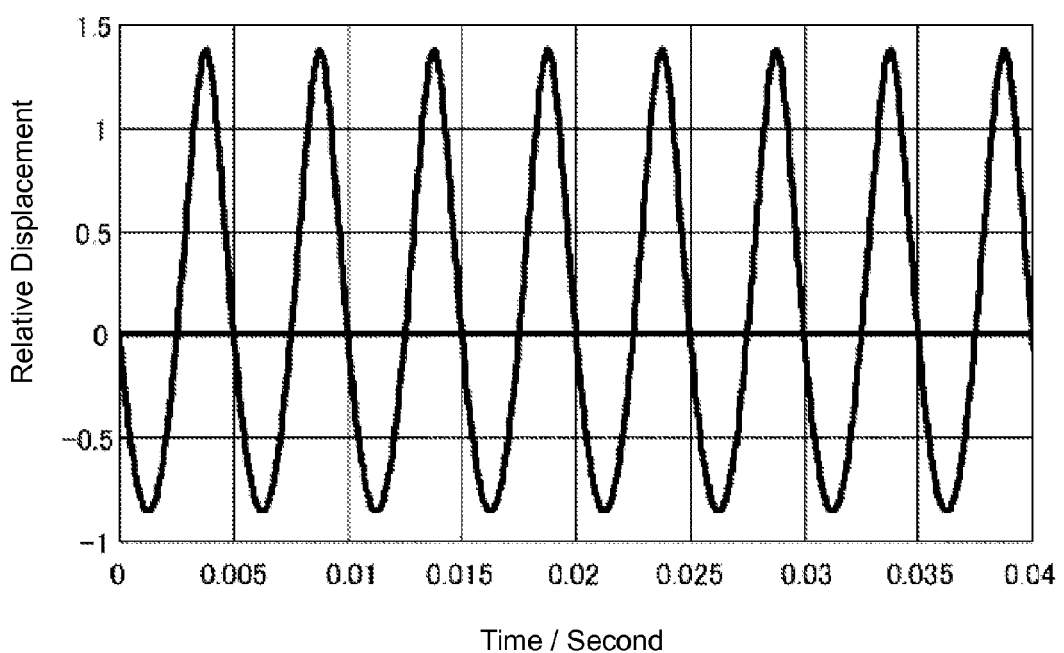
FIG. 3 is a diagram showing a temporal change in relative displacement of the touch panel device of FIG. 1.

FIG. 3 shows a temporal change in relative displacement of the touch panel 16 when the piezoelectric oscillation element 20 is driven with a square wave of a voltage of 18Vpp and a frequency of 200 Hz in the touch panel device 10 in which the piezoelectric oscillation element 20 is made of PZT piezoelectric ceramics (0.2 mm thick with a silver electrode), the elastic body 18 and the wiring protective layer 32 are made of a urethane resin (0.16 mm thick), and the touch panel 16 is made of polycarbonate (0.8 mm thick). In the graph shown in FIG. 3, the positive direction of the vertical axis represents a displacement toward the top side of FIG. 2 above. As shown in the figure, when the piezoelectric oscillation element 20 is driven, the displacement of the touch panel 16 toward the top side becomes greater. This makes it possible to reliably provide a sufficient click feeling to the operator.

The present invention is not limited to the embodiment described above, and various modifications can be made without departing from the spirit of the present invention. For example, the shapes, dimensions, and materials shown in the present specification are examples, and may be appropriately changed as needed.

INDUSTRIAL APPLICABILITY

The present invention can be applied to a piezoelectric oscillation device such as a force feedback touch panel, for example.

DESCRIPTION OF REFERENCE CHARACTERS

10 touch panel device
12 frame
12A front surface
12B rear surface
14 opening
15 receiving section
16 touch panel (support substrate)
18 elastic body
20 piezoelectric oscillation element
22, 24 piezoelectric element
26, 30, 30A, 30B electrode layer
28 piezoelectric layer
32 wiring protective layer
34 terminal substrate
36A, 36B terminal electrode
38A, 38B wiring lines
40 rear panel

The invention claimed is:

1. A piezoelectric oscillation device, comprising: a support substrate; and a piezoelectric oscillation element that causes the support substrate to vibrate,
   wherein the piezoelectric oscillation element is a bimorph piezoelectric oscillation element,
   wherein one main surface of the piezoelectric oscillation element is entirely bonded to the support substrate through an elastic body having a tensile elasticity of 20 to 100 MPa as measured in accordance with JIS K7161, and
   wherein the piezoelectric oscillation device further comprises:
      a terminal substrate disposed on the same surface of the support substrate as a surface to which the piezoelectric oscillation element is bonded, the terminal substrate having a terminal electrode;
      a wiring line that connects the terminal electrode of the terminal substrate to an electrode of the piezoelectric oscillation element; and
      a wiring protective layer disposed between the wiring line and the support substrate, the wiring protective layer being made of an elastic material.

2. The piezoelectric oscillation device according to claim 1, wherein a thickness of the elastic body is 50 to 160 µm.

3. The piezoelectric oscillation device according to claim 1, wherein the elastic body interposed between the support substrate and the piezoelectric oscillation element, and the wiring protective layer are made of the same material.

4. A touch panel device, comprising:
   a support substrate;
   a bimorph piezoelectric element that causes the support substrate to vibrate;
   a frame that supports the support substrate;
   a display part disposed on a rear side of the support substrate, the display part displaying information; and
   a driver that drives the piezoelectric oscillation element in accordance with a contact operation conducted on the support substrate by a user, wherein one main surface of the piezoelectric oscillation element is bonded to the support substrate through an elastic body having a tensile elasticity of 20 to 100 MPa as measured in accordance with JIS K7161, and wherein at least a portion of the piezoelectric element overlaps with the display part in a plan view.

\* \* \* \* \*